United States Patent
Ma

(10) Patent No.: US 10,868,094 B2
(45) Date of Patent: Dec. 15, 2020

(54) DISPLAY DEVICE

(71) Applicant: Japan Display Inc., Tokyo (JP)

(72) Inventor: Chunche Ma, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/282,779

(22) Filed: Feb. 22, 2019

(65) Prior Publication Data

US 2019/0280062 A1 Sep. 12, 2019

(30) Foreign Application Priority Data

Mar. 7, 2018 (JP) .............................. JP2018-040473

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 27/3211* (2013.01); *H01L 51/5092* (2013.01); *H01L 51/5209* (2013.01); *H01L 51/5228* (2013.01); *H01L 51/5234* (2013.01); *H01L 51/5056* (2013.01); *H01L 51/5072* (2013.01); *H01L 51/5096* (2013.01); *H01L 2251/558* (2013.01)

(58) Field of Classification Search
CPC ............. H01L 27/3246; H01L 27/3211; H01L 51/5092; H01L 51/5209; H01L 51/5228; H01L 51/5234; H01L 51/5056; H01L 51/5072; H01L 51/5096; H01L 2251/558
See application file for complete search history.

(56) References Cited

U.S. PATENT DOCUMENTS

| | | | |
|---|---|---|---|
| 2007/0241664 A1* | 10/2007 | Sakamoto | ........... H01L 27/3276 313/503 |
| 2010/0289728 A1* | 11/2010 | Nakatani | ............. H01L 27/3246 345/76 |
| 2012/0091483 A1* | 4/2012 | Matsushima | ....... H01L 27/3246 257/89 |
| 2014/0175469 A1 | 6/2014 | Dozen et al. | |
| 2016/0268354 A1* | 9/2016 | Xiong | ................. H01L 51/5072 |
| 2019/0131577 A1* | 5/2019 | Mishima | ............. H01L 51/5012 |
| 2019/0165085 A1* | 5/2019 | Choi | ................... H01L 51/5228 |

FOREIGN PATENT DOCUMENTS

| | | |
|---|---|---|
| JP | 2010-108927 A | 5/2010 |
| JP | 2014-123527 A | 7/2014 |

* cited by examiner

*Primary Examiner* — Mark W Tornow
(74) *Attorney, Agent, or Firm* — Michael Best & Friedrich LLP

(57) ABSTRACT

A display device includes a substrate, a plurality of pixel electrode over the substrate, a bank covering an end portion of the pixel electrode and exposing a part of the pixel electrode, an organic layer over the pixel electrode and the bank, and a common electrode over the organic layer. The bank includes an inclined surface in a portion covering the end portion of the pixel electrode. An angle between the inclined surface of the bank and an upper surface of the pixel electrode is equal to or larger than 85 degrees. A thickness of the organic layer disposed on the inclined surface of the bank in a direction perpendicular to the inclined surface of the bank is equal to or smaller than 1/10 of a thickness of the organic layer disposed on the pixel electrode in a direction perpendicular to the upper surface of the pixel electrode.

9 Claims, 9 Drawing Sheets

DISPLAY DEVICE

CROSS REFERENCE TO RELATED APPLICATIONS

This application is based on and claims the benefit of priority from the prior Japanese Patent Application No. 2018-040473, filed on Mar. 7, 2018, the entire contents of which are incorporated herein by reference.

FIELD

The present invention relates to a display device.

BACKGROUND

Conventionally, an organic electroluminescence display device (organic EL display device) using an organic electroluminescence material (organic EL material) for a light-emitting element (organic EL element) in a display portion has been known as a display device. Unlike a liquid crystal display device or the like, the organic EL display device is a so-called self-luminescent display device which realizes a display by causing the organic EL material to emit light.

The organic EL element included in the organic EL display device is formed in regions separated by a bank. By controlling the thicknesses of each layer included in the organic EL element, each function of the layers of the organic EL display device can be sufficiently performed.

For example, in order to solve a step disconnection phenomenon in which a cathode is not electrically connected by a bank, Japanese Unexamined Patent Application Publication No. 2010-108927 discloses an organic EL display device in which a layer including a specific material with a sufficient thickness is formed. Also, Japanese Unexamined Patent Application Publication No. 2014-123527 discloses that a display defect of the organic EL display device is prevented by controlling a thickness of a carrier injection layer to suppress a crosstalk phenomenon.

SUMMARY

A display device according to an embodiment of the present invention includes a substrate, a plurality of pixel electrodes over the substrate, a bank covering an end portion of the pixel electrode and exposing a part of the pixel electrode, an organic layer over the pixel electrode and the bank, and a common electrode over the organic layer. The bank includes an inclined surface in a portion covering the end portion of the pixel electrode. An angle between the inclined surface of the bank and an upper surface of the pixel electrode is equal to or larger than 85 degrees. A thickness of the organic layer disposed on the inclined surface of the bank in a direction perpendicular to the inclined surface of the bank is equal to or smaller than 1/10 of a thickness of the organic layer disposed on the pixel electrode in a direction perpendicular to the upper surface of the pixel electrode.

A display device according to an embodiment of the present invention includes a substrate, a plurality of pixels arranged over the substrate, each of the plurality of pixels comprising a pixel electrode, a bank covering an end portion of the pixel electrode, exposing a part of the pixel electrode, and separating the plurality of pixels, an organic layer disposed over the pixel electrode and the bank, the organic layer covering the plurality of pixels, a plurality of light-emitting layers disposed over the pixel electrode through the organic layer, and a common electrode disposed over the organic layer and the light-emitting layer. Each of the plurality of light-emitting layers is provided in each of the plurality of pixels. The bank comprises an inclined surface in a portion covering the end portion of the pixel electrode. The plurality of light-emitting layers includes a first light-emitting layer group emitting a first color and a second light-emitting layer group emitting a second color different from the first color. A first angle between the inclined surface of the bank disposed between adjacent light-emitting layers emitting light of different colors and the upper surface of the pixel electrode is larger than a second angle between the inclined surface of the bank disposed between adjacent light-emitting layers emitting light of the same color and the upper surface of the pixel electrode.

DESCRIPTION OF EMBODIMENTS

An organic EL display device includes organic layers such as a hole injection layer, a hole transport layer, and the like which cover a bank. Since the hole injection layer and the hole transport layer have high conductivity, an electrical color mixing of the organic layers and a crosstalk between pixels due to a lateral leakage occur, which cause a problem in which the reliability of the organic EL display device is decreased.

One object of the present invention is to prevent the electrical color mixing of the organic layers, and the crosstalk between the pixels due to the lateral leakage, and to provide an organic EL display device with improved reliability.

Hereinafter, the embodiments of the present invention are explained with reference to the drawings. However, the present invention can be implemented in a variety of different modes within its concept and should not be interpreted only within the disclosure of the embodiments exemplified below.

In addition, the drawings may be illustrated so that the width, thickness, shape, and the like are illustrated more schematically compared with those of the actual modes in order to provide a clearer explanation. However, they are only an example, and do not limit the interpretation of the present invention. Further, in the specification and the drawings, the same reference number is provided to an element that is the same as that which appears in preceding drawings, and a detailed description may be omitted as appropriate.

Note in the specification that representations such as "above" and "below" when drawings are described represent a relative positional relation between a structure of interest and another structure. In the specification, in a side view, a direction from a substrate to a common electrode, which will be described further below, is defined as "above", and a direction opposite thereto is defined as "below".

In the specification and claims, when a mode represented as "a structure is arranged above another structure" includes both of a case in which a structure is arranged straight above another structure so as to be in contact with the other structure and a case in which a structure is arranged above another structure via still another structure, unless otherwise specified.

First Embodiment

Figure 1:
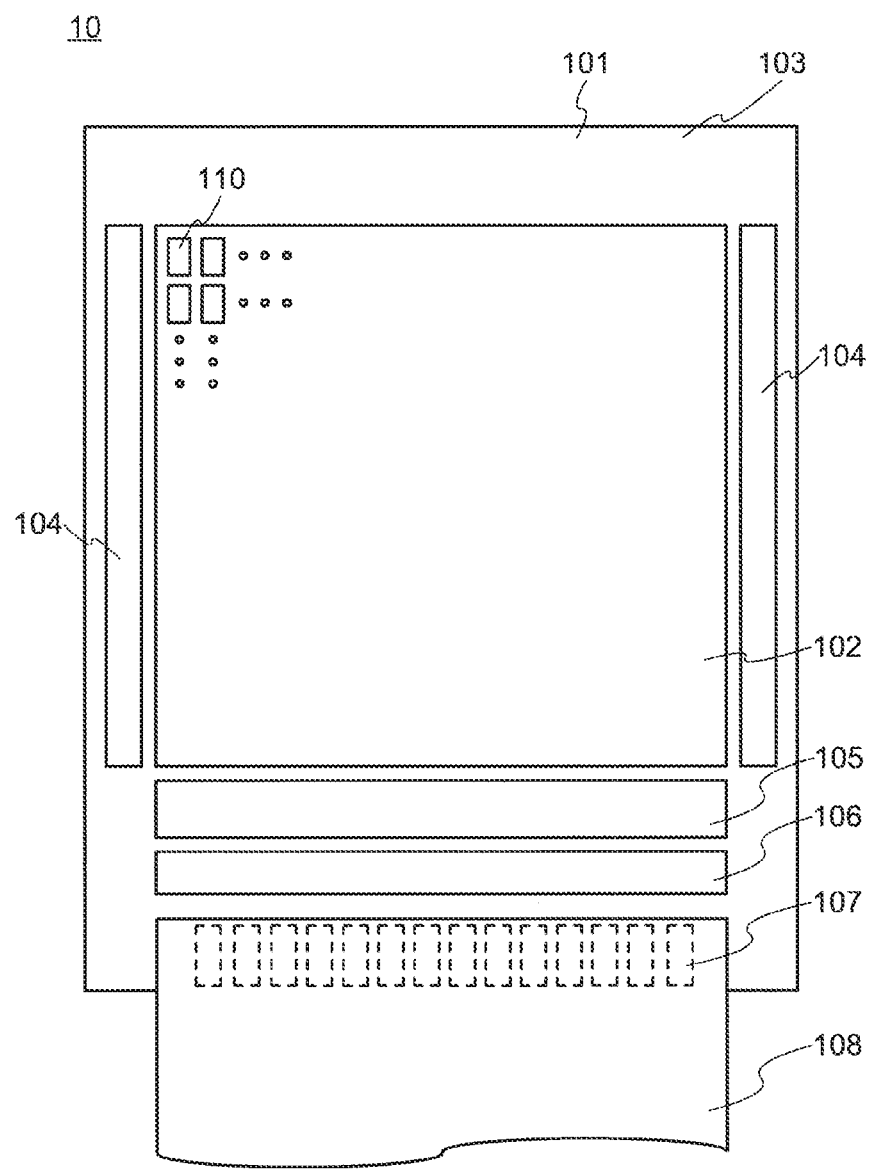
FIG. 1 is a schematic diagram of an organic EL display device according to a first embodiment of the present invention.

FIG. 1 is a schematic diagram of an organic EL display device according to a first embodiment of the present invention. In the present specification, a view of the organic EL display device 10 from a direction perpendicular to a screen (display region) is referred to as a "planar view".

As shown in FIG. 1, a display region 102, a peripheral region 103 positioned around the display area 102, a scanning line driving circuit 104, and a data line driving circuit 105 are formed on an insulating surface and a driver integrated circuit (IC) 106 is disposed in an organic EL display device 10.

The driver IC 106 functions as a control unit for inputting a signal to the scanning line driving circuit 105. The data line driving circuit 105 may be incorporated into the driver IC 106.

The driver IC 106 may be separately disposed on a substrate 101 in a form such as an IC chip or may be externally connected to a flexible printed circuit (FPC) 108 in which the driver IC is provided. The FPC 108 is connected to a terminal 107 provided in the peripheral region 103.

The substrate 101 supports layers such as a pixel electrode, an insulating layer, and the like over the substrate 101. The substrate 101 may be composed of an insulating material having an insulating surface or may have an insulating surface by forming an insulating film on the substrate 101. As long as the substrate 101 has an insulating surface, the quality of a material for the substrate and a material forming the insulating film are not particularly limited.

A plurality of pixels 110 are arranged in a matrix in the display region 102. Each of the pixels 110 includes a pixel electrode, described below, and a pixel-electrode-side functional layer (a hole injection layer, a hole transport layer, and an electron-blocking layer), a light-emitting layer, a common-electrode-side functional layer (an electron injection layer, an electron transport layer, and a hole-blocking layer), and a common electrode which are stacked over the pixel electrode.

A data signal corresponding to image data is input from the data line driving circuit 105 to each of the pixels 110. A transistor electrically connected to the pixel electrode provided in each of the pixels 110 is driven in response to the data signal so that an image corresponding to the image data can be displayed in the screen.

As the transistor, for example, a thin film transistor (TFT) can be used. However, the transistor is not limited to the thin film transistor. Any element may be used if it has a current control function.

Figure 2:
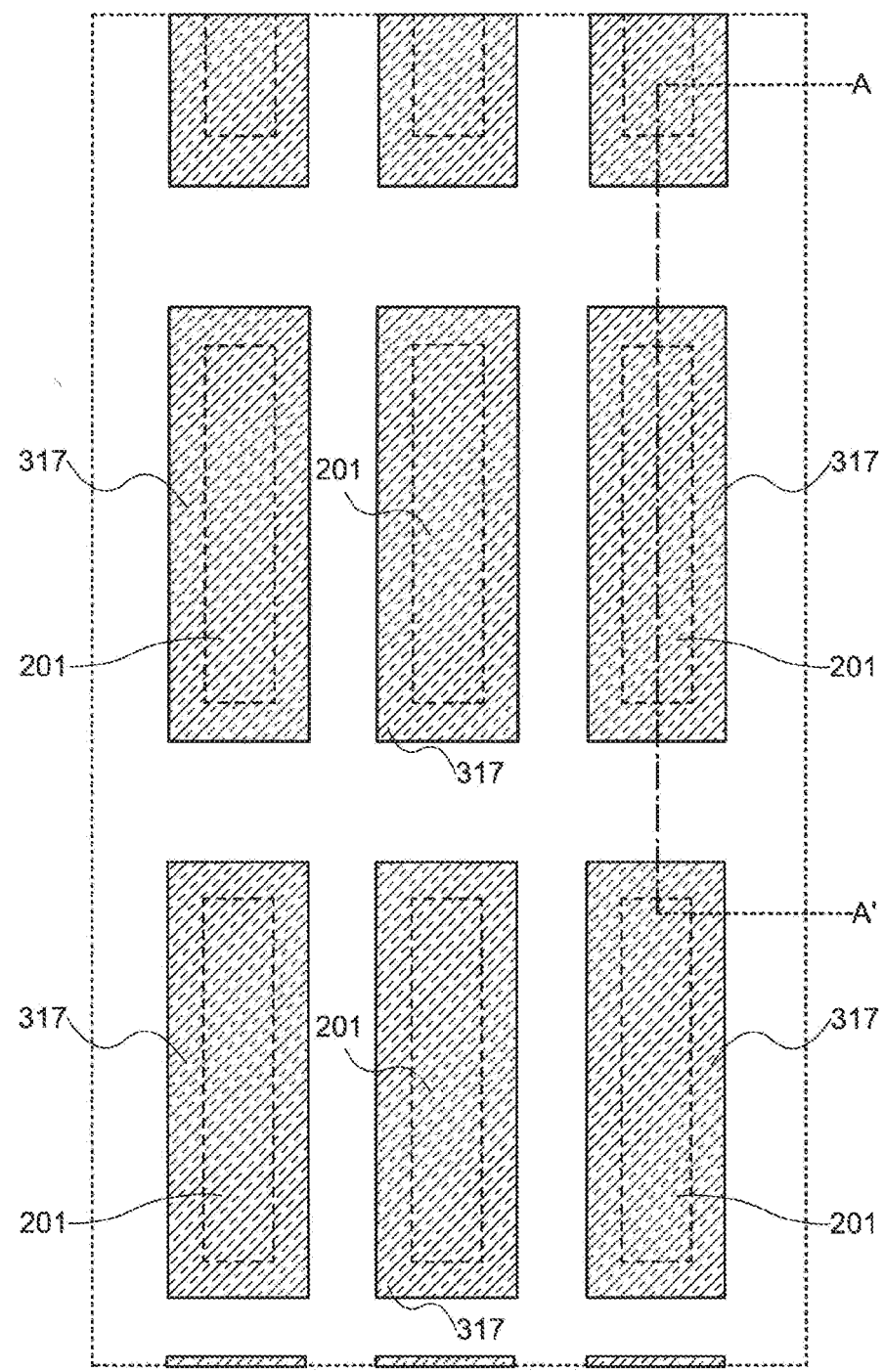
FIG. 2 is a diagram illustrating a display region of the organic EL display device according to the first embodiment of the present invention.

FIG. 2 is a diagram illustrating an example of a configuration of the display region in the organic EL display device. FIG. 2 shows a configuration in which includes six light-emitting elements 201 form a part of the display region 102 see in a planar view. In FIG. 2, configurations of the present invention other than the light-emitting elements 201 and the light emitting-layers 317 are omitted.

While six light-emitting elements 201 are shown in FIG. 2, several millions of light-emitting elements or more are actually arranged in a matrix over the pixels.

Each of pixels 110, described above, includes the pixel electrode, and the pixel-electrode-side functional layer (the hole injection layer, the hole transport layer, and the electron-blocking layer), the light emitting layer, the common-electrode-side functional layer (the electron injection layer, the electron transport layer, and the hole-blocking layer), and the common electrode which are stacked over the pixel electrode.

The light-emitting element 201 is provided over the pixel electrode 314 having a portion exposed through an opening 300 of a bank 315, described below. The bank 315 covers an end portion of the pixel electrode and is provided between the adjacent pixel electrodes.

In the first embodiment, while the example has been described in which pixels are in a stripe arrangement as a pixel arrangement, the pixels may be in a delta arrangement, a Bayer arrangement, a PenTile arrangement, or the like.

Figure 3:
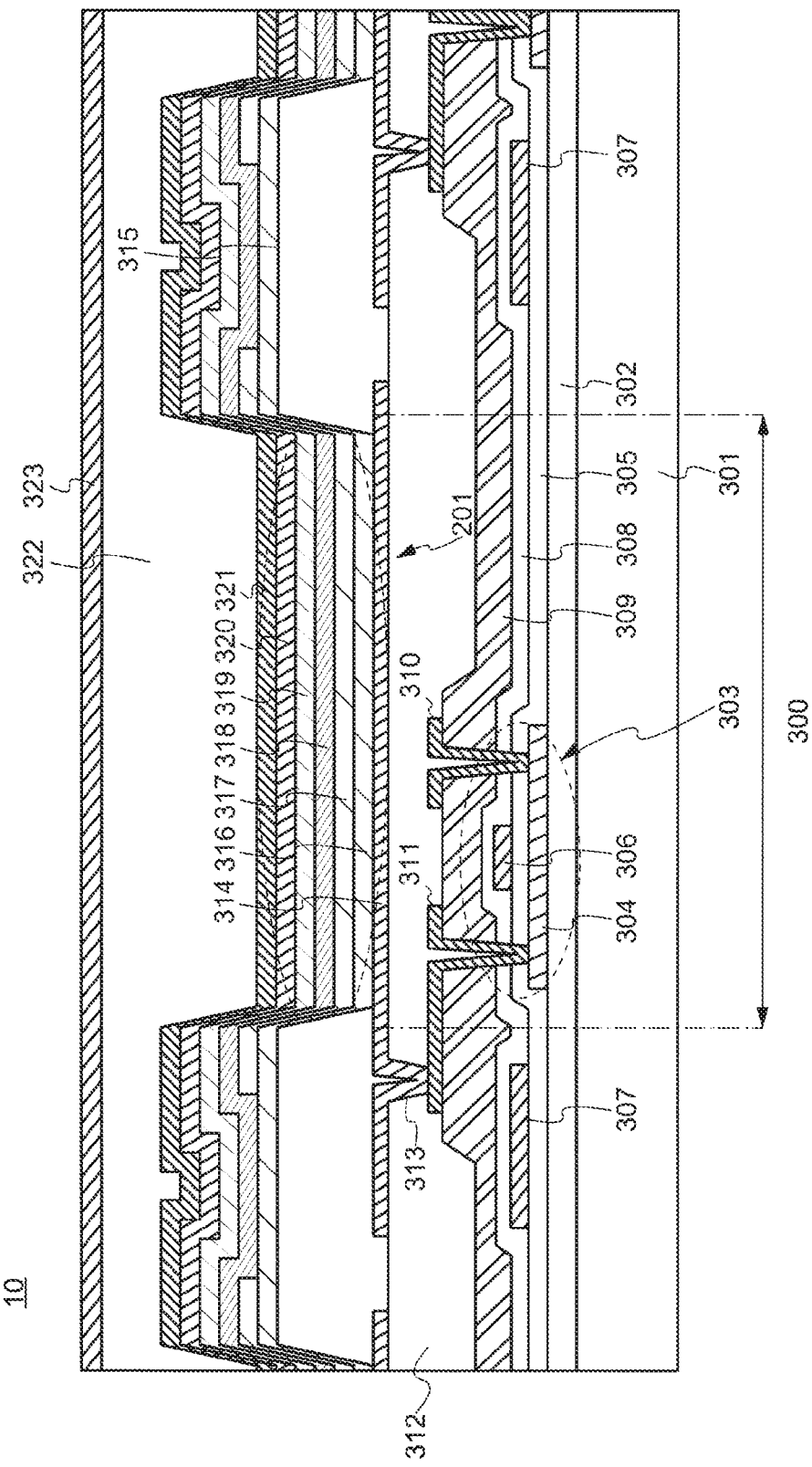
FIG. 3 is a cross-sectional view along a line A-A' of FIG. 2 according to the first embodiment of the present invention.

FIG. 3 is a cross-sectional view along a line A-A' of FIG. 2 according to the first embodiment of the present invention. The organic EL display device 10 includes a substrate 301, a base layer 302, a thin film transistor 303, a first insulating layer 312, a pixel electrode 314, a bank 315, a pixel-electrode-side functional layer 316, a light-emitting layer 317, a common-electrode-side functional layer 318, a common electrode 319, an auxiliary electrode 320, a first layer 321, a second layer 322, and a third layer 323.

The organic EL display device 10 includes the substrate 301. A glass substrate, a quartz substrate, a flexible substrate (a resin substrate having flexibility composed of polyimide, polyethylene terephthalate, polyethylene naphthalate, or the like) can be used for the substrate 301.

When the substrate 301 does not require a light-transmitting property, a metal substrate, a ceramic substrate, or a semiconductor substrate can also be used.

The base layer 302 is provided on the substrate 301. The base layer 302 is an insulating layer including an inorganic material such as silicon oxide, silicon nitride, aluminum oxide, or the like.

The base layer 302 is not limited to a single layer and may have a stacked structure of a silicon oxide layer and a silicon nitride layer. The structure of the base layer 302 may be determined, as needed, in consideration of its adhesion property to the substrate 301 and a gas barrier property against the thin film transistor 303, described below.

The thin film transistor 303 is provided on the base layer 302. A structure of the thin film transistor 303 may be of a top gate type or a bottom gate type. In this example, the structure of the thin film transistor 303 is of the top gate type.

In the first embodiment, the thin film transistor 303 includes a semiconductor layer 304 provided on the base layer 302, a gate insulating film 305 covering the semiconductor layer 304, a gate electrode 306 provided on the gate insulating film 305, interlayer insulating films 308 and 309 covering the gate electrode 306, and a source electrode 310 and a drain electrode 311 each electrically connected to the semiconductor layer 304 on the interlayer insulating film 309. In the first embodiment, while an example in which the interlayer insulating film has a stacked structure of the interlayer insulating films 308 and 309, the interlayer insulating film may be a single layer.

A wiring 307 including the same material as the metal material composing the gate electrode 306 can be provided in the same layer as that provided with the gate electrode 306. The wiring 307 can be provided as a scanning line driven by the scanning line driving circuit 104.

Although not shown in FIG. 3, a wiring extending in a direction intersecting the wiring 307 can be provided in the same layer as that provided with the source electrode 310 and the drain electrode 311. The wiring can be provided as a signal line driven by the data driving circuit 105.

The first insulating layer 312 is provided on the thin film transistor 303. The first insulating layer 312 functions as a planarizing film. The first insulating film 312 includes an organic resin material. The organic resin material can include known organic resin materials such as polyimide, polyamide, acrylic, and epoxy. The first insulating layer 312 is not limited to a single layer and may have a stacked structure of a layer including an organic resin material and an inorganic insulating layer.

The first insulating layer 312 includes a contact hole 313 which exposes a part of the source electrode 310 or the drain electrode 311. The contact hole is an opening to electrically connect a pixel electrode 314, described below, and the source electrode 310 or the drain electrode 311 to each other.

The contact hole 313 overlaps a part of the source electrode 310 or the drain electrode 311. The source electrode 310 or the drain electrode 311 is exposed at a bottom of the contact hole 313.

The pixel electrode 314 is provided on the first insulating layer 312. The pixel electrode 314 overlaps the contact hole 313 and is electrically connected to the source electrode 310 or the drain electrode 311 exposed at the bottom surface of the contact hole 313.

A part of the pixel electrode 314 is exposed by an opening 300 of the bank 315, described below. An end portion of the pixel electrode 314 is covered with the bank 315, described below.

The bank 315 is provided on the pixel electrode 314. The bank 315 is provided to cover an end portion of the pixel electrode 314 between the pixel electrodes 315 adjacent to each other. The bank 315 includes the opening 300 over a part of the pixel electrode 314.

An inner wall of the opening 300 in the bank 315 is formed in a tapered shape. That is, an upper surface of the pixel electrode 314 and an inclined surface of the bank 315 intersect at an angle θ (not shown).

Since the inclined surface of the bank 315 and the upper surface of the pixel electrode 314 has the angle θ, thicknesses of the pixel-electrode-side functional layer 316, described below, the light-emitting layer 317, and the common-electrode-side functional layer 318 in a direction perpendicular to the inclined surface of the bank 315 can be thinned.

In addition, since the inner wall of the opening in the bank 315 has the tapered shape, a coverage defect at the end portion of the pixel electrode 314 can be reduced when the light-emitting layer 317, described below, is formed.

A material of the bank 315 may be an inorganic material or an organic resin material. In addition, the bank 315 may have a stacked structure of the inorganic material and the organic resin material. As the inorganic material, for example, silicon nitride or silicon oxide can be used. The organic resin material can include known organic resin materials such as polyimide, polyamide, acrylic, and epoxy. Silicon nitride or silicon oxide is preferably used as the material of the bank 315.

When silicon nitride or silicon oxide is used, the tapered shape of the bank 315 can be easily formed. That is, the angle θ between the upper surface of the pixel electrode 314 and the inclined surface of the bank 315 can be increased.

When the angle θ between the inclined surface of the bank 315 and the upper surface of the pixel electrode 314 is increased, thicknesses of the pixel-electrode-side functional layer 316, described below, the light-emitting layer 317, and the common-electrode-side functional layer 318 in the direction perpendicular to the inclined surface of the bank 315 can be further thinned.

The pixel-electrode-side functional layer 315 is provided on the bank 315. The pixel-electrode-side functional layer 315 includes the hole injection layer, described below, the hole transport layer, and the electron-blocking layer.

The light-emitting layer 317 is provided on the pixel-electrode-side functional layer 315. The light-emitting layer 317 includes an organic light-emitting material. A known material such as a derivative of a polycyclic aromatic compound can be used as the organic light-emitting material.

In this example, the light-emitting layer 317 which emits light of a desired color is provided in the organic EL display device 10. The organic EL display device 10 displays colors of red (R), green (G), and blue (B) by forming a different light-emitting layer 317 over each of the pixel electrodes 314.

In addition, the light-emitting layer 317 has a light-emitting layer 317 which emits white light, and the colors of red (R), green (G), and blue (B) may be displayed through a color filter.

The common-electrode-side functional layer 318 is provided on the light-emitting layer 317. The common-electrode-side functional layer 318 includes the electron injection layer, described below, the electron transport layer, and the hole-blocking layer.

A low-molecular material such as a triazole-based, oxazole-based, oxadiazole-based, silole-based, or boron-based material can be used as the electron transport material. The electron transport material can be formed by a vapor deposition method or a printing method.

The common electrode 319 is provided on the common-electrode-side functional layer 318. In this example, since the organic EL display device 10 is of a top emission type, a transparent electrode is used as the common electrode 319. The common electrode 319 is electrically connected to an external terminal through a conductive layer provided below the common electrode 319 in a peripheral region in the vicinity of an end portion of the display region 102.

A MgAg thin film or a transparent conductive film (such as ITO or IZO) can be used as a thin film configuring the transparent electrode. When the MgAg thin film is used, a thickness of the MgAg thin film needs to be thin enough to transmit light.

When the common electrode 319 having a thickness sufficient to transmit light is disposed over the inclined surface of the bank 315, the thickness of the common electrode 319 in the direction perpendicular to the inclined surface of the bank 315 is smaller than a thickness of the common electrode 319 in a direction perpendicular to the upper surface of the pixel electrode 314. Therefore, resistance of the common electrode 319 disposed over the inclined surface of the bank 315 is increased.

The auxiliary electrode 320 is provided on the common electrode 319. A metal wiring can be used as the auxiliary electrode 320. Specifically, since resistance of the MgAg thin film as common electrode 319, described above, is large, the auxiliary electrode 320 provided as the metal wiring can compensate for the thickness of the MgAg thin film and decrease the resistance.

In this example, since the organic EL display device 10 is of a top emission type, the metal wiring preferably includes an opening pattern in a part of a region. For example, a lattice-shaped or stripe-shaped opening pattern may be used as the opening pattern.

A metal oxide having a high refractive index can be used as the auxiliary electrode 320. Specifically, the metal oxide having a refractive index of 2.1 or more can be used. Indium tin oxide (ITO) or indium zinc oxide (IZO) can be used as the metal oxide having a refractive index of 2.1 or more.

Since the resistance of the MgAg thin film as the common electrode 319, described above, is large, ITO or IZO provided as the auxiliary electrode 320 can compensate for the thin thickness of the MgAg thin film and decrease the resistance.

Since ITO or IZO is a transparent conductive film, it can transmit light. Furthermore, since ITO or IZO has a high refractive index, light extraction efficiency can be improved.

The first layer 321, the second layer 322, and the third layer 323 are provided over the auxiliary electrode 320. The first layer 321 and the third layer 323 function as a blocking layer to prevent entry of external impurities and the second layer 322 functions as a planarizing layer to provide a planarized surface.

Figure 4:
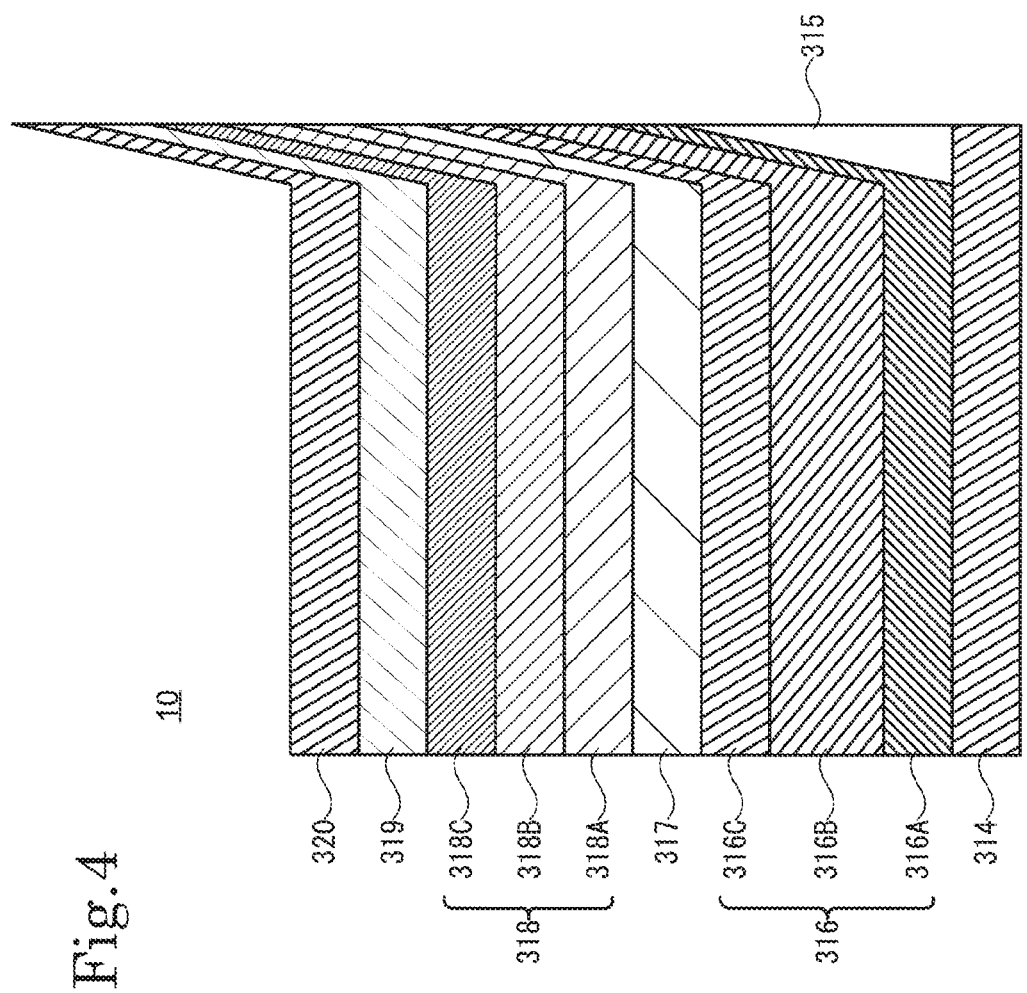
FIG. 4 is an enlarged view of a part of FIG. 3 according to the first embodiment of the present invention.

FIG. 4 is an enlarged view of a part of FIG. 3. Specifically, FIG. 4 is an enlarged cross-sectional view from the pixel electrode 314 to the auxiliary electrode 320 of a portion having a tapered shape of the bank 315 in the cross-sectional view along the line A-A' of FIG. 2 according to the first embodiment of the invention.

The organic EL display device 10 includes the pixel electrode 314, the bank 315, the pixel-electrode-side functional layer 316, the light-emitting layer 317, the common-electrode-side functional layer 318, the common electrode 319, and the auxiliary electrode 320.

The pixel-electrode-side functional layer 316 includes a hole injection layer 316A, a hole transport layer 316B, and an electron-blocking layer 316C.

The hole injection layer 316A is provided on the pixel electrode 314. The hole transport layer 316B is provided on the hole injection layer 316A. The electron-blocking layer 316C is provided over the hole transport layer 316B.

The hole injection layer 316A has a function for injecting holes into the hole transport layer 316B. A hole transporting material having a low resistance property can be used as the hole transport layer 316B.

Specifically, as the material of the hole transport layer 316B, a conjugated heterocyclic-based low-molecular material or polymer material having a low resistance property such as benzidine or derivative thereof, styrylamine or a derivative thereof, triphenylmethane or a derivative thereof, porphyrin or a derivative thereof, triazole or a derivative thereof, imidazole or a derivative thereof, oxadiazole or a derivative thereof, polyarylalkane or a derivative thereof, phenylene Diamine or a derivative thereof, arylamine or a derivative thereof, oxazole or a derivative thereof, anthracene or a derivative thereof, fluorenone or a derivative thereof, hydrazone or a derivative thereof, stilbene or a derivative thereof, phthalocyanine or a derivative thereof, a polysilane-based compound, a vinylcarbazole-based compound, a thiophene-based compound, an anilin-based compound, or the like can be used. The derivatives, described above, monomers, or oligomers can be used as the low-molecular material.

The hole injection layer 316A can be formed using a known film formation method. For example, a spin-coating method, an inkjet method, a printing method, or a vapor deposition method can be used.

The vapor deposition method is preferably used to further thin a thickness of the hole injection layer 316A in the direction perpendicular to the bank 315. Among the hole transport layer materials described above, a low-molecular material having a low resistance property can be used as the hole transporting material suitable for the vapor deposition method.

The hole transport layer 316B has a function for transporting holes injected from the hole injection layer 315A. The same hole transporting material as the hole injection layer can be used as the hole transport layer 316B.

The electron-blocking layer 316C has a function for preventing electrons injected from the common electrode side into the light-emitting layer 318 from escaping into to the pixel electrode side. A hole transporting material is used as the electron-blocking layer 316C.

The light-emitting layer 317, described above, is provided on the electron-blocking layer 316C.

The common-electrode-sided functional layer 318 is provided on the light-emitting layer 317. The common-electrode-side functional layer 318 includes an electron injection layer, an electron transport layer, or a hole-blocking layer. The electron injection layer, the electron transport layer, or the hole-blocking layer includes an electron transport material.

A low-molecular material such as a triazole-based, oxazole-based, oxadiazole-based, silole-based, or boron-based material can be used as the electron transport material. The electron transport material can be formed by a vaper deposition method or a printing method.

The common electrode 319, described above, can be provided on the common-electrode-side functional layer 318. The auxiliary electrode 320, described above, can be provided on the common electrode 319.

Figure 5:
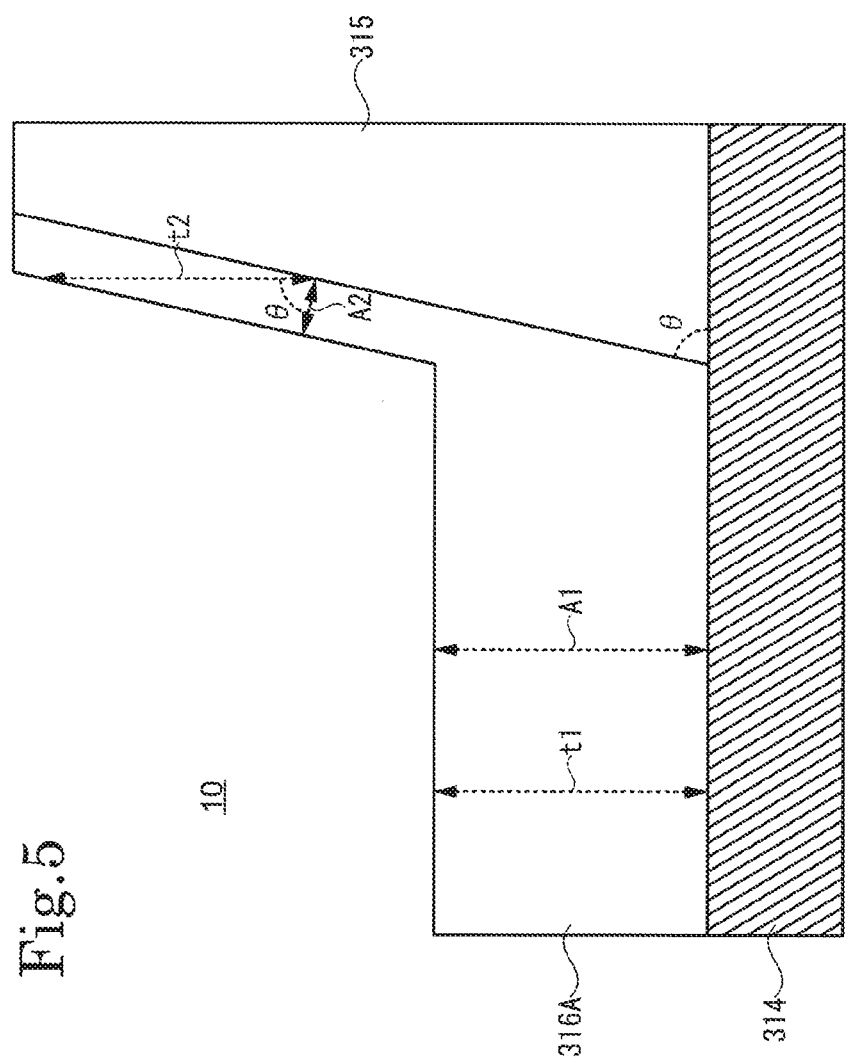
FIG. 5 is a schematic diagram according to FIG. 4.

FIG. 5 is a schematic diagram of FIG. 4 according to the first embodiment 1 of the present invention. Specifically, FIG. 5 is a cross-sectional schematic diagram illustrating the pixel electrode 314, the inclined surface of the bank 315, and the hole injection layer 316A in the cross-sectional view of FIG. 4 according to the first embodiment of the present invention.

In the hole injection layer 316A, t1 is defined as a thickness of a layer disposed on the upper surface of the pixel electrode 314 in the direction perpendicular to the upper surface of the pixel electrode 314 and t2 is defined as a thickness of a layer disposed on the inclined surface of the bank 315 in the direction perpendicular to the surface of the pixel electrode 314.

In the hole injection layer 316A, A1 is defined as a thickness of the layer disposed on the upper surface of the pixel electrode 314 in the direction perpendicular to the inclined surface of the bank 315 and A2 is defined as a thickness of the layer disposed on the inclined surface of the bank in the direction perpendicular to the inclined surface of the bank 315.

The vapor deposition method is preferably used to further thin the thickness of the hole injection layer 316A, described above, in the direction perpendicular to the upper surface of the bank 315. In the vapor deposition method, the thickness of the hole injection layer 316A is approximately constant. In this case, A1 and t1 are almost the same.

In the case of the vapor deposition method, t1 and t2 are almost the same. Therefore, A1 is almost the same as t2. Also, in the vapor deposition method, a thickness of a layer disposed over the upper surface of the pixel electrode 314 and a thickness of a layer disposed over the inclined surface of the bank 315 in the direction perpendicular to the upper surface of the pixel electrode 314 are the same, not only in the hole injection layer 316A but also in the pixel-electrode-side functional layer, the light-emitting layer, and the common-electrode-side functional layer.

In a relationship between A2 and t2, since an angle between a normal direction of the upper surface of the pixel electrode and a normal direction of the inclined surface is θ when an angle between the upper surface of the pixel electrode 314 and the inclined surface of the bank 315 is θ, A2 is proportional to 1/cos θ of t2.

Accordingly, the relationship between A1 and A2 shows that A2 is proportional to 1/cos θ of A1.

Figure 6:
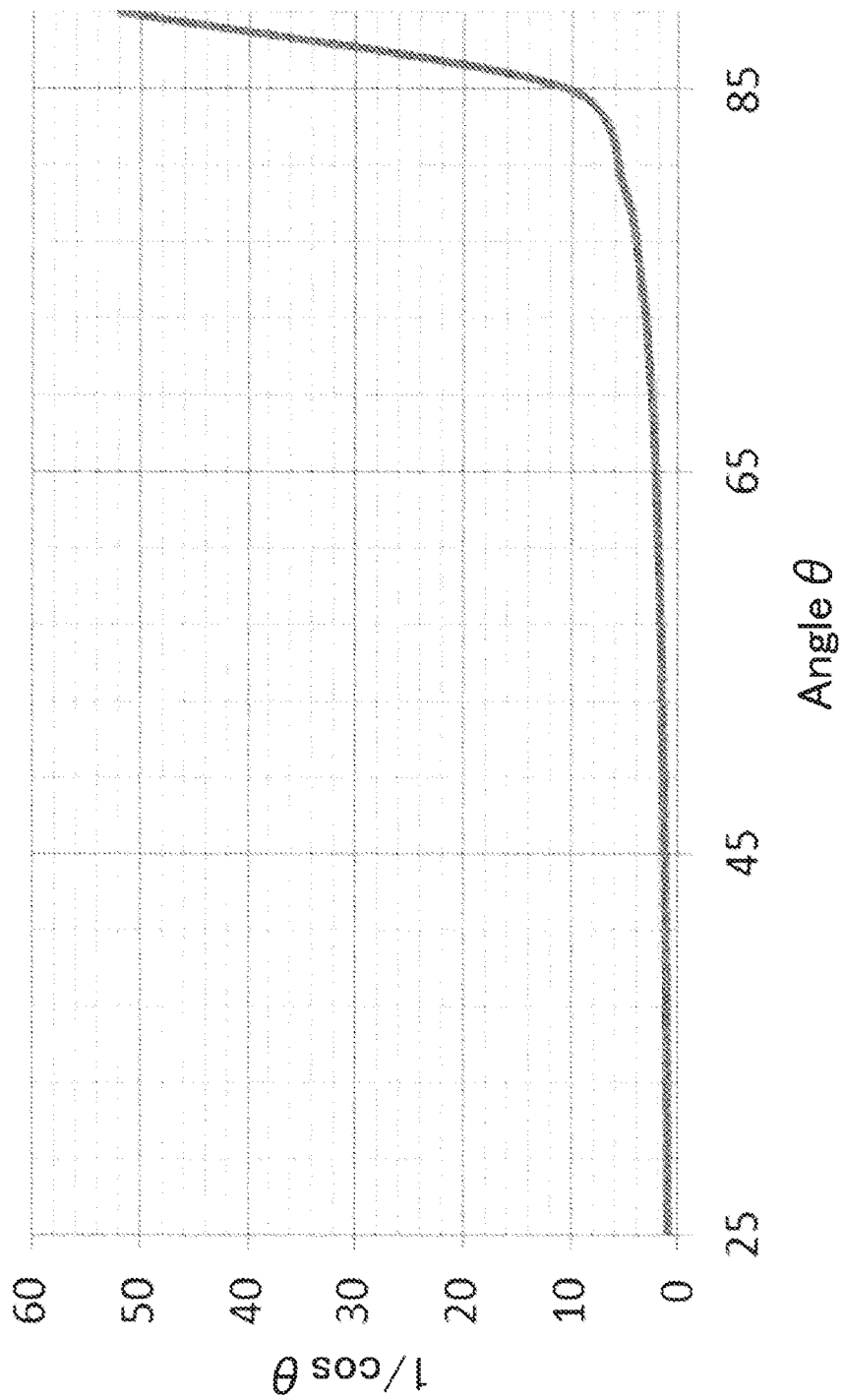
FIG. 6 is a diagram illustrating a relationship between an angle $\theta$ formed by an inclined surface of the bank and an upper surface of a pixel electrode and $1/\cos\theta$ according to the first embodiment of the present invention.

FIG. 6 is a diagram illustrating a relationship between the angle θ formed by the inclined surface of the bank and the upper surface of the pixel electrode and 1/cos θ according to the first embodiment of the present invention. When the angle θ is larger than 85 degrees, a value of 1/cos θ is equal to or smaller than 1/10. Therefore, in the hole injection layer 316A, the thickness A2 of the layer on the inclined surface of the bank 315 is equal to or smaller than 1/10 of the thickness A1 of the layer on the pixel electrode 314.

Figure 7:
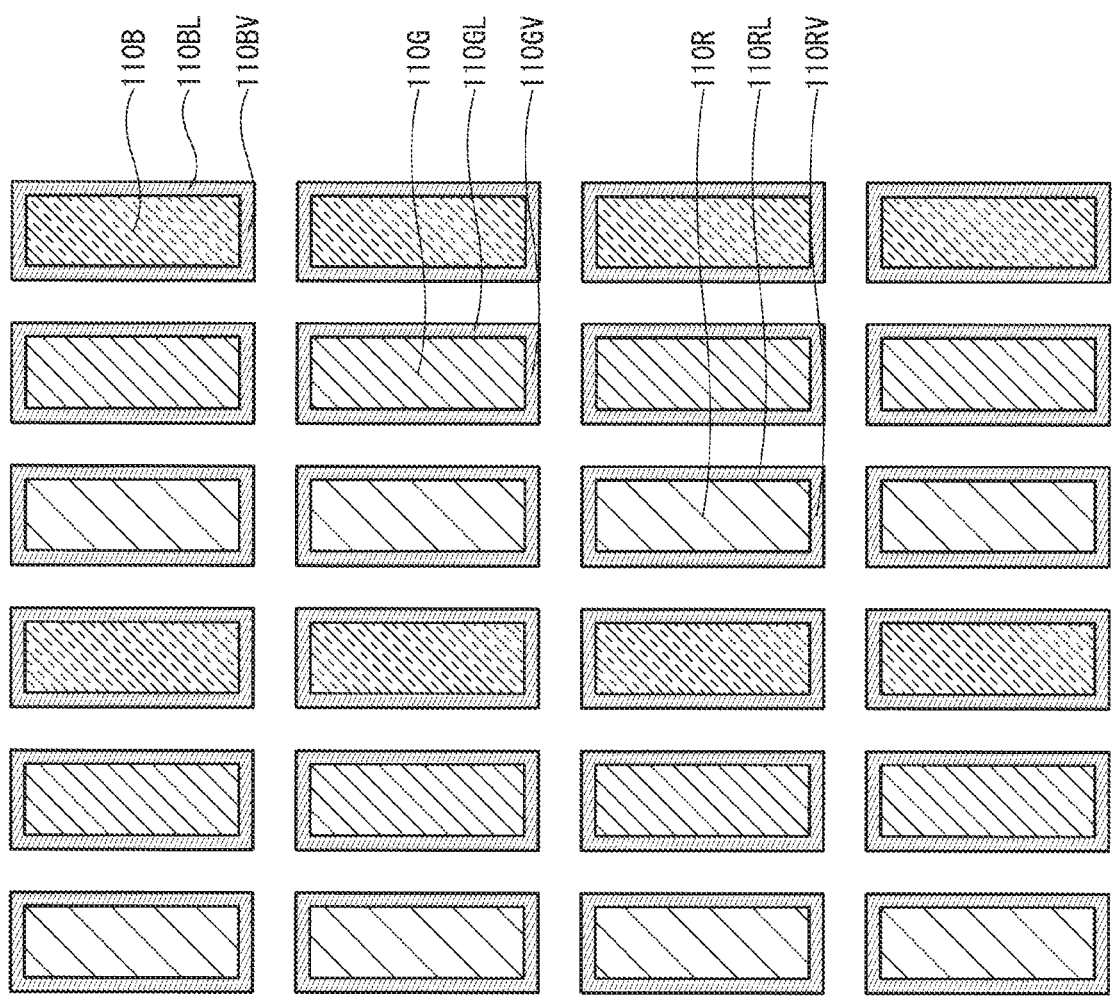
FIG. 7 is a diagram illustrating an arrangement of pixels according to the first embodiment of the present invention.

FIG. 7 is a diagram illustrating an arrangement of pixels according to the first embodiment. Each of a plurality of light-emitting layers is provided in each of a plurality of pixels. The plurality of light-emitting layers include a first light-emitting group that emits a first color and a second light-emitting group that emits a second color different from the first color. In FIG. 7, the plurality of pixels include a pixel corresponding to a red color (R) 110R, a pixel corresponding to a green color (G) 110G, and a pixel corresponding to a blue color (B) 110B. Each of the pixels is arranged in a matrix in a planar view. Furthermore, each of a column of the pixels corresponding to red color 110R, a column of the pixels corresponding to green color 110G, and a column of the pixels corresponding to blue color 110B is arranged in a stripe shape repeated in this order.

In this example, in a column direction of the pixel corresponding to red color 110R, an angle 91 between the inclined surface 110RV of the bank between the adjacent pixels corresponding to red color and the upper surface of the pixel 314 is larger than 85 degrees.

That is, in the column direction of the pixel corresponding to red color 110R, the inclined surface of the bank 315 has the angle θ1 larger than 85 degrees. Similarly, in the column direction of the pixel corresponding to green color 110G or in the column direction of the pixel corresponding to blue color 110B, the inclined surface of the bank 315 has the angle θ1 larger than 85 degrees.

In this example, in a row direction perpendicular to the column direction, each of inclined surfaces 110RL, 110GL and 110BL of the bank between the pixel corresponding to red color 110R, the pixel corresponding to green color 110G, and the pixel corresponding to blue color 110B has an angle 92 larger than 85 degrees.

In this manner, the inclined surfaces 110RV, 110GV and 110BV of the bank in the column direction and the inclined surfaces 110RL, 110GL and 110BL of the bank in the row direction, which are between any adjacent pixels of the pixels corresponding to red color 110R, the pixels corresponding to green color 110G and the pixels corresponding to blue color 100B, have the angle θ1 and the angle 92 larger than 85 degrees, respectively.

In that case, thicknesses of the pixel-electrode-side functional layer 316 including the hole injection layer 316, the light-emitting layer 317, and the common-electrode-side functional layer 318 stacked over the bank 315 are smaller than 1/10 of thicknesses of the pixel-electrode-side functional layer 316 including the hole injection layer 316, the light-emitting layer 317, and the common-electrode-side functional layer 318 stacked over the pixel electrode 314, respectively.

Therefore, since each resistance of the pixel-electrode-side functional layer 316 including the hole injection layer 316A, and the common-electrode-side functional layer is increased, the electrical color mixing of the organic layers and the crosstalk between the pixels due to the lateral leakage are prevented, and thus, the organic EL display device with improved reliability can be provided.

Second Embodiment

Figure 8:
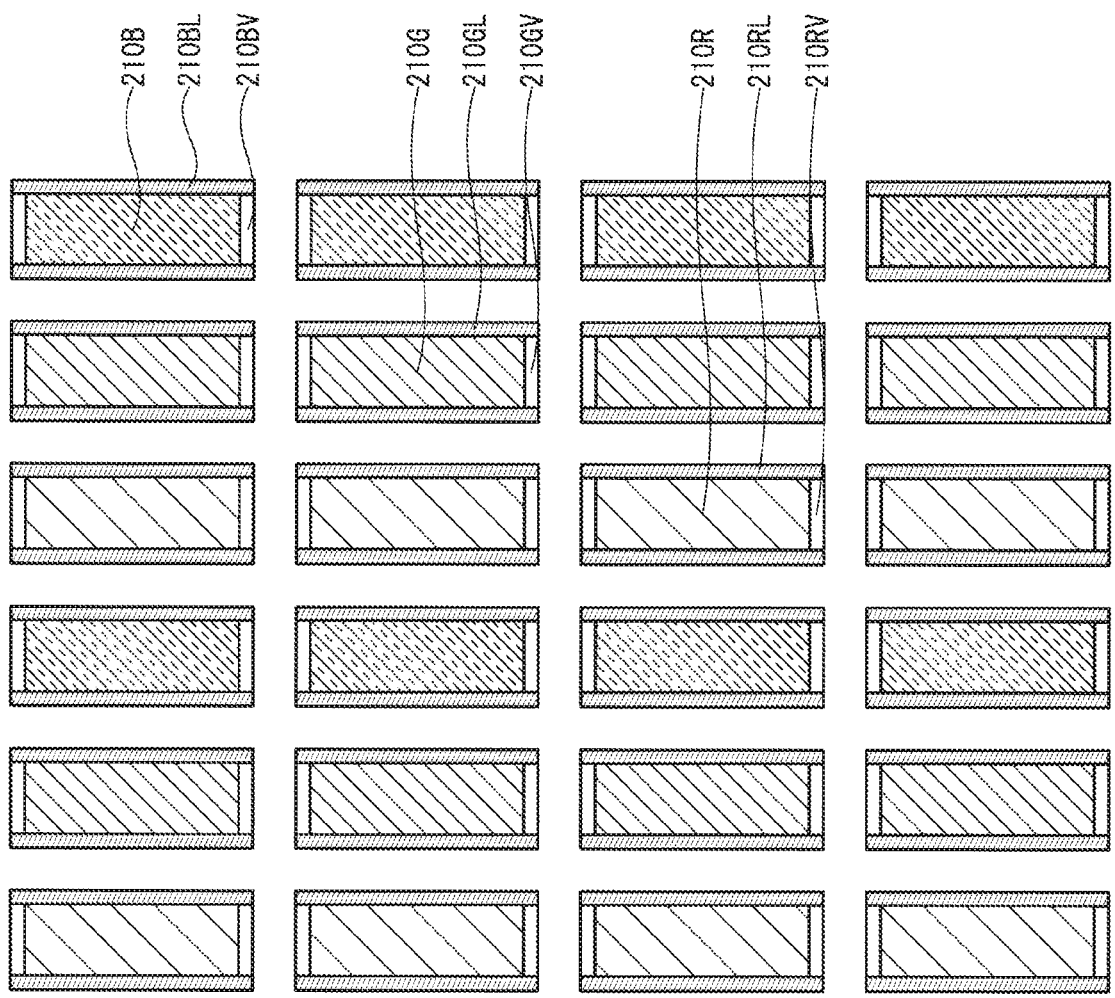
FIG. 8 is a diagram illustrating an arrangement of pixels according to a second embodiment of the present invention.

FIG. 8 is a diagram illustrating an arrangement of pixels according to a second embodiment of the present invention. Each of the pixels is arranged in a matrix in a planar view. Furthermore, each of a column of pixels corresponding to red color 210R, a column of pixels corresponding to green color 210G, and a column of pixels corresponding to blue color 210B is repeatedly arranged in a stripe shape in this order.

Unlike the first embodiment, an organic EL display device 20 according to the second embodiment can prevent the electrical color mixing even if all angles of inclined surfaces of the bank 315 are not larger than 85 degrees. Hereinafter, a part of the configurations different from the first embodiment will be described.

In this example, in the column direction, inclined surfaces 210RV, 210GV and 210BV of the bank between the adjacent pixels corresponding to red color 210R, the adjacent pixels corresponding to green color 210G, or the adjacent pixels corresponding to blue color 210B each have the angle θ1 smaller than 85 degrees.

In this manner, unlike the first embodiment, each of the inclined surfaces 210RV, 210GV and 210BV of the bank in the column direction has the angle θ1 smaller than 85 degrees and each of the inclined surfaces 210RL, 210GL and 210BL of the bank in the row direction has an angle 92 larger than 85 degrees.

Therefore, since only each resistance of the pixel-electrode-side functional layer 316 including the hole injection layer 316A, and the common-electrode-side functional layer which are stacked over the bank 315 between the pixels corresponding to different colors is increased, the color mixing of the organic layers and the crosstalk between the pixels due to the lateral leakage are prevented, and thus, an organic EL display device with improved reliability can be provided.

Third Embodiment

Figure 9:
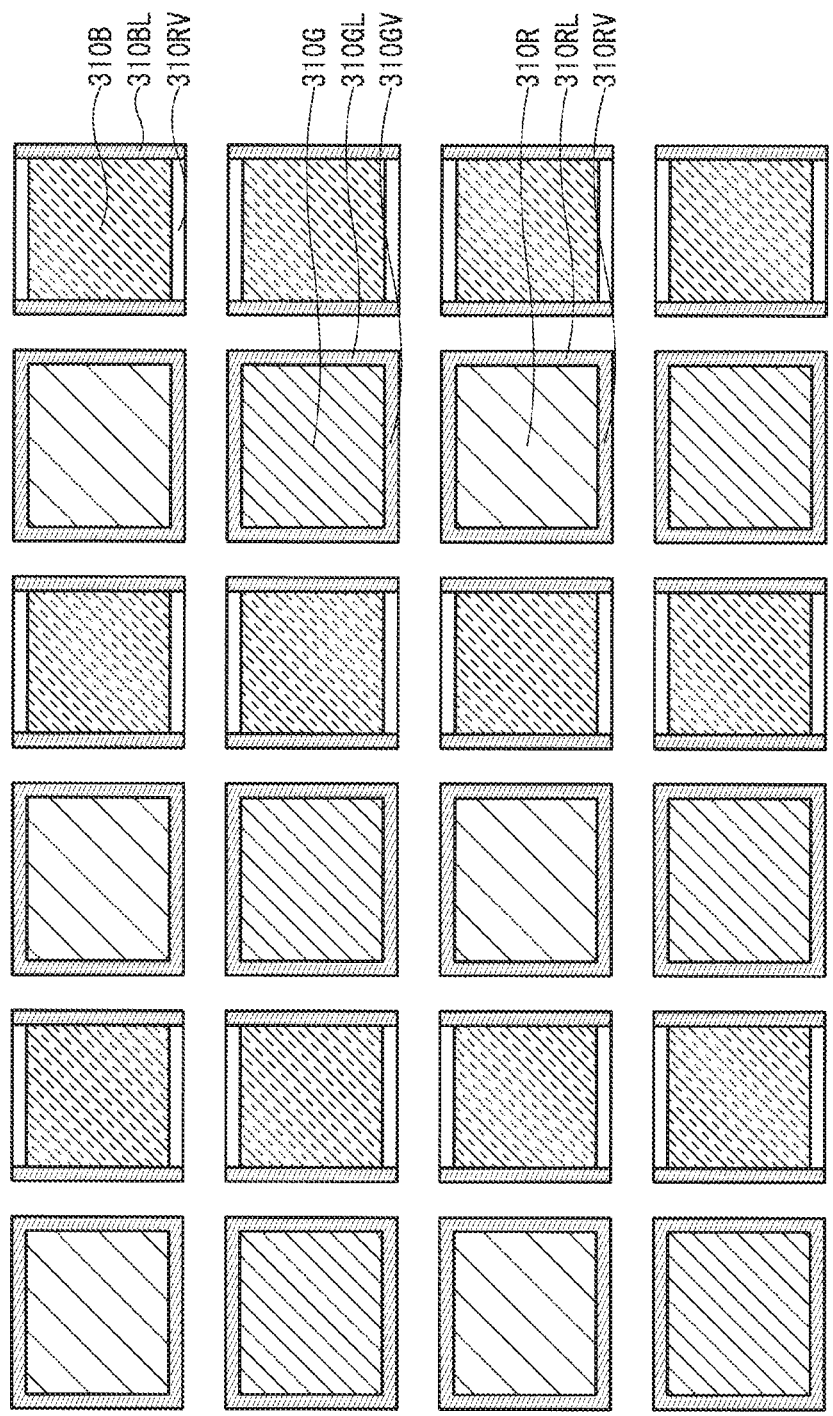
FIG. 9 is a diagram illustrating an arrangement of pixels according to a third embodiment of the present invention.

FIG. 9 is a diagram illustrating an arrangement of pixels according to a third embodiment of the present invention. Each of the pixels is arranged in a matrix in a planar view. Furthermore, each of a column in which a pixel corresponding to red color 310R and a pixel corresponding to green color 310G are alternately arranged and a column of pixels corresponding to blue color 210B is repeatedly arranged in this order.

Unlike the first embodiment, an organic EL display device 30 according to the third embodiment can prevent the electrical color mixing while compensating for a decrease in luminance of the pixels corresponding to blue color, which has a relatively shorter lifetime than the pixels corresponding to red color and the pixels corresponding to green color. Hereinafter, a part of the configurations different from the first embodiment will be described.

In this example, each of the column in which the pixel corresponding to red color 310R and the pixel corresponding to green color 310G are alternately arranged and the column of the pixels corresponding to blue color 210B is repeatedly arranged in this order.

While the pixel corresponding to red color 310R and the pixel corresponding to green color 310G are alternately arranged, the column of the pixels corresponding to blue color 310B includes only the pixels corresponding to blue color 310B.

Therefore, the pixels corresponding to blue color 310B are arranged twice as large as the number of the pixels corresponding to red color 310R and the pixels corresponding to green color 310G.

In this example, in the column direction, inclined surfaces 310RV, 310GV and 310BV of the bank between the adjacent pixels corresponding to red color 310R, the adjacent pixels corresponding to green color 310G, or the adjacent pixels corresponding to blue color 310B each have the angle θ1 smaller than 85 degrees.

In this manner, unlike the first embodiment, the pixels corresponding to blue color 310B are arranged as large as the number of the pixels corresponding to red color 310R and the pixels corresponding to green color 310G.

Unlike the first embodiment, in the pixels corresponding to red color 310R, the pixels corresponding to green color 310G, and the pixels corresponding to blue color 310B, each of the inclined surfaces 310RV, 310GV and 310BV of the bank in the column direction has the angle θ1 smaller than 85 degrees and each of inclined surfaces 310RL, 310GL and 310BL of the bank in the row direction has an angle 92 larger than 85 degrees.

Since each resistance of the pixel-electrode-side functional layer 316 including the hole injection layer 316A, and the common-electrode-side functional layer which are stacked over the inclined surface of the bank between pixels corresponding to different colors is increased, the color mixing of the organic layers and the crosstalk between the pixels due to the lateral leakage are prevented, and thus, an organic EL display device with improved reliability can be provided while compensating for a decrease in luminance of the pixels corresponding to blue color, which has a relatively shorter lifetime than the pixels corresponding to red color and the pixels corresponding to green color.

Any mode which is realized by persons ordinarily skilled in the art through the appropriate addition, deletion, or design change of elements or through the addition, deletion, or condition change of a process based on the organic EL display device described as the embodiments of the present invention is included in the scope of the present invention as long as they possess the concept of the present invention. Furthermore, the aforementioned modes described as the embodiments of the present invention can be implemented by appropriately combining with each other as long as no contradiction is caused.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a substrate;
    a plurality of pixels arranged over the substrate, each of the plurality of pixels comprising a pixel electrode;
    a bank covering an end portion of the pixel electrode, exposing a part of the pixel electrode, and separating the plurality of pixels, wherein the exposed part of the pixel electrode defines a light emitting region of one of the plurality of pixels;
    an organic layer disposed over the pixel electrode and the bank, the organic layer covering the plurality of pixels;
    a plurality of light-emitting layers disposed over the pixel electrode with the organic layer disposed therebetween; and
    a common electrode disposed over the organic layer and the light-emitting layer, wherein the plurality of light-emitting layers includes a first light-emitting layer group emitting a first color and a second light-emitting layer group emitting a second color different from the first color,
    two adjacent light emitting layers in a first direction emit light of different colors,
    two adjacent light emitting layers in a second direction perpendicular to the first direction emit light of the same color,
    the bank comprises a first inclined surface facing one light emitting region in the first direction and a second inclined surface facing the one light emitting region in the second direction, and
    a first angle between the first inclined surface and the upper surface of the pixel electrode is larger than a second angle between the second inclined surface and the upper surface of the pixel electrode.

2. The display device according to claim 1, wherein the first color is blue,
    the second color is green, and
    a number of the first light-emitting layer group is larger than a number of the second light emitting layer group.

3. The display device according to claim 1, wherein the first angle is equal to or larger than 85 degrees, and a thickness of the organic layer disposed on the first inclined surface in a direction perpendicular to the first inclined surface is equal to or smaller than /1;10 of a thickness of the organic layer disposed on the pixel electrode in a direction perpendicular to the upper surface of the pixel electrode.

4. The display device according to claim 1, wherein the bank comprises silicon nitride or silicon oxide.

5. The display device according to claim 1, wherein the organic layer comprises a hole injection layer.

6. The display device according to claim 1, wherein the organic layer includes a hole injection layer, and the hole injection layer comprises a low-molecular organic compound selected from the group consisting of benzidine or derivative thereof, styrylamine or a derivative thereof, triphenylmethane or a derivative thereof, porphyrin or a derivative thereof, triazole or a derivative thereof, imidazole or a derivative thereof, oxadiazole or a derivative thereof, polyarylalkane or a derivative thereof, phenylene diamine or a derivative thereof, arylamine or a derivative thereof, oxazole or a derivative thereof, anthracene or a derivative thereof, fluorenone or a derivative thereof, hydrazone or a derivative thereof, stilbene or a derivative thereof, phthalocyanine or a derivative thereof, a polysilane-based compound, a vinylcarbazole-based compound, a thiophene-based compound, and an anilin-based compound.

7. The display device according to claim 1, further comprising a layer comprising indium tin oxide or indium zinc oxide over the common electrode.

8. The display device according to claim 1, further comprising a metal wiring over the common electrode,
   wherein the metal wiring comprises an opening pattern over in a part of a region.

9. The display device according to claim 8, wherein the opening pattern is a stripe-shaped pattern or a lattice-shaped pattern.

* * * * *